United States Patent [19]

Kang et al.

[11] Patent Number: 5,665,990
[45] Date of Patent: Sep. 9, 1997

[54] METAL OXIDE SEMICONDUCTOR DEVICE WITH SELF-ALIGNED GROOVE CHANNEL AND METHOD FOR MANUFACTURING THE SAME

[75] Inventors: Won-Gu Kang; Sung-Weon Kang; Yeo-Whan Kim; Jong-Sun Lyu, all of Daejeon, Rep. of Korea

[73] Assignee: Electronics & Telecommunications Research Institute, Daejeon-shi, Rep. of Korea

[21] Appl. No.: 749,153

[22] Filed: Nov. 14, 1996

Related U.S. Application Data

[63] Continuation of Ser. No. 351,706, Dec. 8, 1994, abandoned.

[30] Foreign Application Priority Data

Oct. 26, 1994 [KR] Rep. of Korea ............... 94-27479

[51] Int. Cl.$^6$ ........................... H01L 29/41
[52] U.S. Cl. ............ 257/330; 257/332; 257/365
[58] Field of Search ........................ 257/327, 345, 257/249, 250, 329, 330, 334, 346, 332, 662, 401, 411, 409, 365, 387

[56] References Cited

U.S. PATENT DOCUMENTS

| | | | |
|---|---|---|---|
| 4,167,745 | 9/1979 | Ishibashi et al. | 257/332 |
| 5,021,846 | 6/1991 | Ueno | 257/346 |
| 5,082,795 | 1/1992 | Temple | 437/41 |
| 5,422,505 | 6/1995 | Shirai | 257/345 |
| 5,510,648 | 4/1996 | Davies et al. | 257/365 |

FOREIGN PATENT DOCUMENTS

| | | | |
|---|---|---|---|
| 0162768 | 6/1990 | Japan | 257/330 |
| 0263871 | 11/1991 | Japan | 257/327 |
| 0058537 | 2/1992 | Japan | 257/409 |
| 0211159 | 8/1992 | Japan | 257/365 |
| 4-211159 | 8/1992 | Japan | 257/365 |
| 0082785 | 4/1993 | Japan | 257/330 |

*Primary Examiner*—Tom Thomas
*Assistant Examiner*—David B. Hardy
*Attorney, Agent, or Firm*—Antonelli, Terry, Stout & Kraus, LLP

[57] ABSTRACT

A metal oxide semiconductor device with a self-aligned groove channel structure is disclosed comprising a substrate in which a first channel region of a first conductivity type and source and drain regions of a second conductivity type are formed, a first gate insulating layer formed on the first channel region, and a first gate electrode formed on the gate insulating layer, a second gate electrode having a self-aligned groove structure formed at both sides of the first gate electrode; a second gate insulating layer formed between the substrate and the second gate insulating layer; and a non-planar second channel region of the first conductivity type formed under the second gate insulating layer and doped with a different concentration of an impurity from the first channel region. The groove structure prevents an electric field produced in the vicinity of a drain from penetrating into the channel region to lessen a short channel effect. The length of an effective channel is increased by the groove structure, and also a junction depth of source/drain regions can be further increased by a depth of the groove in comparison with the conventional MOS device. The source/drain resistance is lowered, and reliability is increased due to lessening the effect of a junction spike of a metallization and/or an electro-migration.

10 Claims, 4 Drawing Sheets

METAL OXIDE SEMICONDUCTOR DEVICE WITH SELF-ALIGNED GROOVE CHANNEL AND METHOD FOR MANUFACTURING THE SAME

This application is a continuation of application Ser. No. 08/351,706, filed Dec. 8, 1994, now abandoned.

BACKGROUND OF THE INVENTION

1. Field of the Invention

The present invention relates to a semiconductor device, and more particularly to a metal oxide semiconductor device with a self-aligned groove channel formed at edges of source/drain regions therein and a method for manufacturing the same.

2. Description of the Prior Art

FIG. 1 shows a construction of a prior art metal oxide semiconductor (hereinafter, referred to as "MOS") device in which an active layer is formed between two field oxide layers.

As shown in FIG. 1, the prior art MOS device comprises a gate electrode 14 formed on a silicon substrate 10 with a gate insulating layer 12 interposed therebetween, source/drain regions formed between the field oxide layer 18 and the gate electrode 14, and a channel region 11 formed just under the gate insulating layer 12. Reference numeral 20 is an insulating layer for electrically isolating the gate and source/drain electrodes, and reference numeral 22 is source/drain electrode formed on the source/drain region 16 through a contact hole.

In the prior art MOS device of FIG. 1, a length of the channel region 11 must be shortened in proportion to integration thereof, and also a junction depth of the source/drain region 16 must be made shallow in accordance with a scaling rule.

However, if a length of the channel 11 is shortened, a leakage current is increased due to punch-through and the like. To reduce such a leakage current, a junction depth of the source/drain region 16 must be made shallower. If the junction depth thereof is made shallower, resistance is increased in the source/drain region 16. In fabrication of the MOS device having a shallow source/drain region, particularly during performing metallization, a spike-shaped metal such as aluminum or the like is penetrated into the silicon substrate 10. There arises the problem that such an MOS device has seriously lowered reliability due to junction breakdown and electro-migration caused by a spiking of metal.

In addition, the above-mentioned problem is not eliminated even in an MOS device having an LDD (lightly doped drain) structure in which a relatively lightly doped impurity region relative to a source/drain region is formed between the source/drain region and the channel region.

As described above, in the case that an MOS device has a channel having the length of less than a micron, there arise the problems that a short channel effect occurs in the device and resistance is increased in source/drain region therein.

SUMMARY OF THE INVENTION

It is an object of the present invention to provide a metal oxide semiconductor device with a self-aligned groove channel and a method for manufacturing the same so as to prevent such a short channel effect and to increase the resistance of a source/drain region.

It is another object of the present invention to provide a metal oxide semiconductor with a self-aligned channel and a method for manufacturing the same so as to prevent the device from having a junction breakdown caused by s spiking of metal during metallization and to prevent reliability of the device from being lowered due to electro-migration.

According to the present invention, the metal oxide semiconductor device with a self-aligned groove channel structure comprises a substrate in which first channel region of a first conductivity type is formed source and drain regions of a second conductivity type are formed, a first gate insulating layer is formed on the first channel region, and a first gate electrode is formed on the gate insulating layer, and further comprising a second gate electrode having a groove structure formed at both sides of the first gate electrode by a self-aligned method; a second gate insulating layer is formed between the substrate and the second gate insulating layer; and a second channel region of the first conductivity type is formed under the second gate insulating layer and is doped with a different concentration of an impurity than doped in the first channel region.

The groove structure has a recess portion formed by a well-known etching method in the substrate, the recess portion being formed of one of a rectangular shape, a rounding shape, and a polygon shape.

An impurity concentration of the first channel region is lower than that an impurity concentration of the second channel region, and the first conductivity type is N type.

An impurity concentration of each of the first and second channel regions is higher than that of the substrate, and the first conductivity type is N type.

An impurity concentration of the first channel region is lower than an impurity concentration of the second channel region, and the first conductivity type is P type.

An impurity concentration of each of the first and second channel regions is higher than an impurity concentration of the substrate, and the first conductivity type is P type.

According to another aspect of the present invention, the method of fabricating a metal oxide semiconductor device comprises the steps of defining an active region on a silicon substrate of a first conductivity type, growing a gate oxide layer on the active region and then depositing a polysilicon layer to form a first gate electrode by means of a predetermined patterning; depositing a silicon nitride layer thereon and forming a first side wall spacer at both edges of the first gate electrode by means of an anisotropic reactive ion etching; forming a thermal oxide layer only on the gate oxide layer to form a thick oxide layer; removing the side wall spacer and the gate oxide layer only under the side wall spacer, and then etching the substrate up to a predetermined depth so as to form a groove structure in the substrate; injecting an impurity ion of a first conductivity type into the substrate through the groove structure; forming a polysilicon layer on the groove structure to form a second gate electrode; and injecting an impurity ion of a second conductivity type into source/drain regions through the oxide layer.

In the MOS device, the groove structure prevents an electric field produced in the vicinity of a drain from penetrating into the channel region, and as a result a short channel effect is restrained.

In addition, a length of an effective channel is increased by the groove structure, and also a Junction depth of source/drain regions can be further increased by a depth of the groove in comparison with the conventional MOS device.

Accordingly, in the MOS device fabricated by the present invention, a source/drain resistance can be lowered, and it is possible to prevent a degrading of reliability due to a junction spike of a metallization and/or an electro-migration.

BRIEF DESCRIPTION OF THE DRAWINGS

This invention may be better understood and its object will become apparent to those skilled in the art by reference to the accompanying drawings as follows.

DESCRIPTION OF THE PREFERRED EMBODIMENT(S)

Figure 2A:
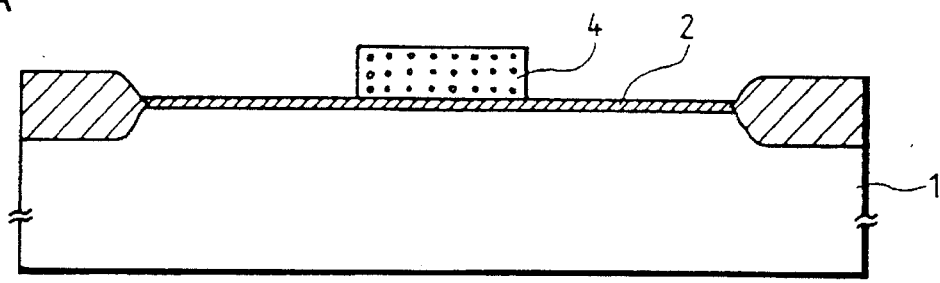
FIGS. 2A to 2D are cross-sectional views showing the steps of a method for manufacturing an MOS device according to one embodiment of the present invention.

Referring to FIG. 2A, on a semiconductor substrate 1 in which a well and an active region are formed, a silicon oxide layer 2 is and then a polysilicon layer 4 for forming a gate electrode is deposited and patterned on the silicon oxide layer 2.

Figure 2B:
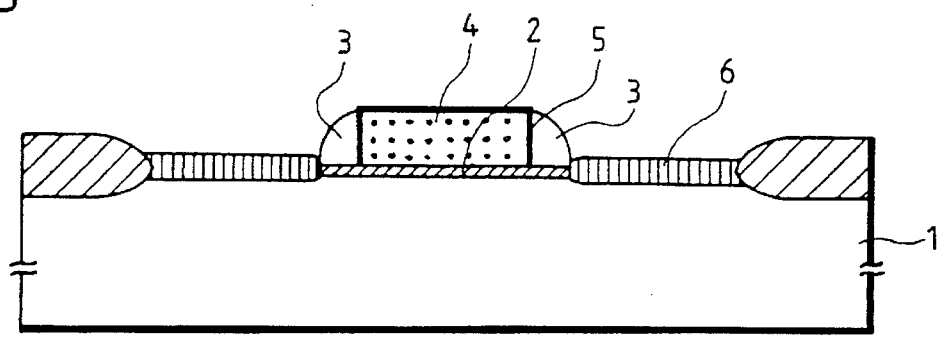

As shown in FIG. 2B, around the gate polysilicon layer 4, a thin oxide layer 5 is formed by thermal-oxidation of the polysilicon layer 4 or a well-known chemical vapor deposition, and then a silicon nitride layer is deposited thereon. Next, by an anisotropic RIE (reactive ion etching), the silicon nitride layer is selectively etched away to form a side-wall spacer 3 at both side edges of the polysilicon layer 4 with the oxide layer 5 interposed therebetween. Then, a thermal oxide layer is formed thereon in a high-temperature furnace, and by a well-known etching process a thick thermal oxide layer 6 is selectively formed only on regions in which source and drain are formed, as shown in FIG. 2B.

Figure 2C:
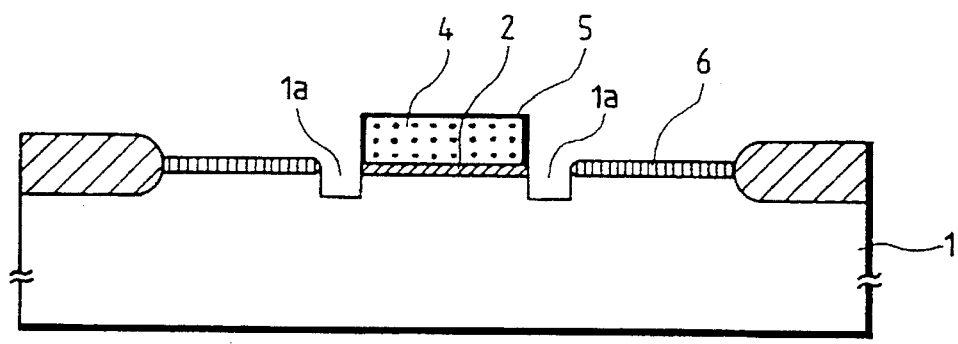

With reference to FIG. 2C, the side wall spacer 3 is removed by a dry etching or a wet etching, and then the thin oxide layer 2 only beneath the side wall spacer 3 also is removed by the dry etching. Next, the substrate 1 exposed at both sides of the gate polysilicon layer 4 (i.e. at edge of one side of source/drain region) is selectively removed by a dry etching or a wet etching up to a certain depth of from 30 to 300 nm, and therefore a groove structure is formed in the substrate, as shown in FIG. 2C. On performing the etching process for formation of the groove structure, the source/drain region is protected by the thick oxide layer 6.

In this embodiment, the groove structure can be sufficiently fabricated using the same masks as used in a conventional technique, and therefore it is not required that an additional mask process is performed.

Figure 2D:
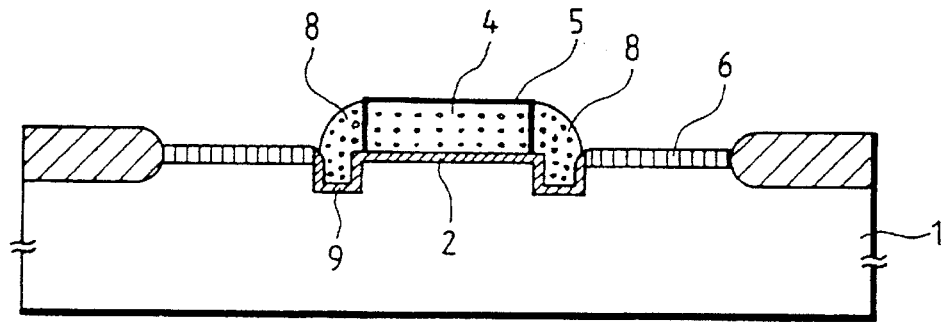

In FIG. 2D, ion injection is carried out to control a threshold voltage, and then a silicon oxide layer 9 is thermally formed inside the groove in a high-temperature furnace. Also, a polysilicon layer is deposited thereon and selectively removed by the RIE process, and therefore a side-wall spacer 8 of polysilicon is formed at both side edges of the gate polysilicon layer 4.

Subsequent processes are similar to that of a conventional method of making an MOS device, and description thereof is omitted. In the method of the present invention, during forming a gate electrode a contact hole must be formed so as to apply a voltage to the side-wall spacer 8 as well.

Figure 1:
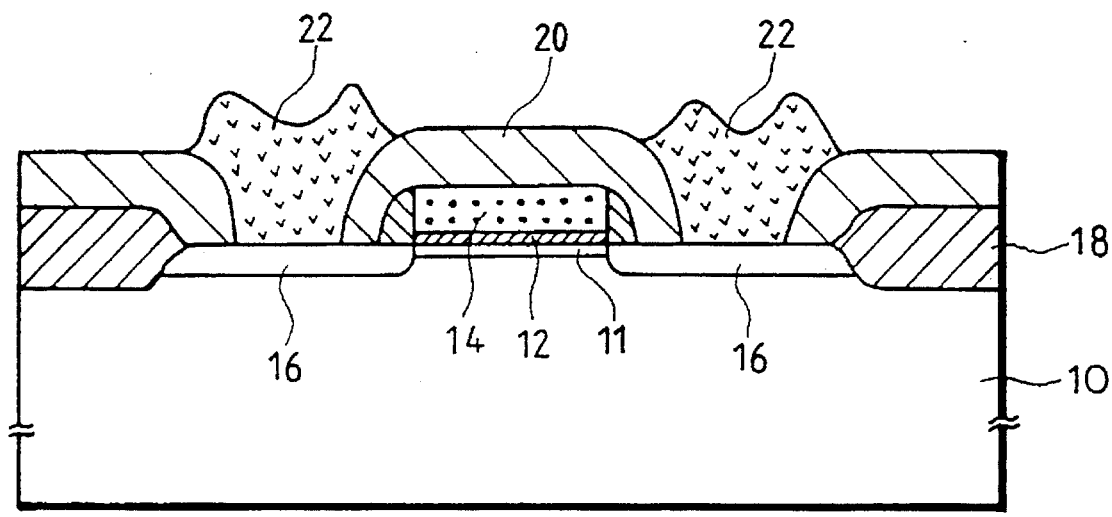
FIG. 1 is a cross-sectional view showing the construction of typical prior art metal oxide semiconductor devices.
Figure 3:
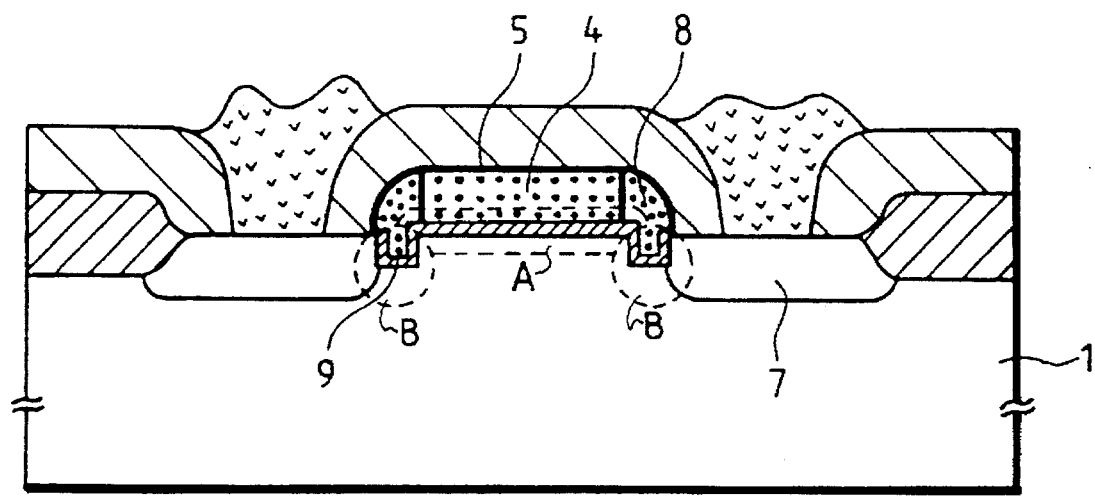
FIG. 3 is a cross-sectional view showing the construction of the MOS device which is manufactured in accordance with the method of the present invention.

The construction of the MOS device which is fabricated in accordance with the above-described method of the present invention is shown in FIG. 3.

Figure 6:
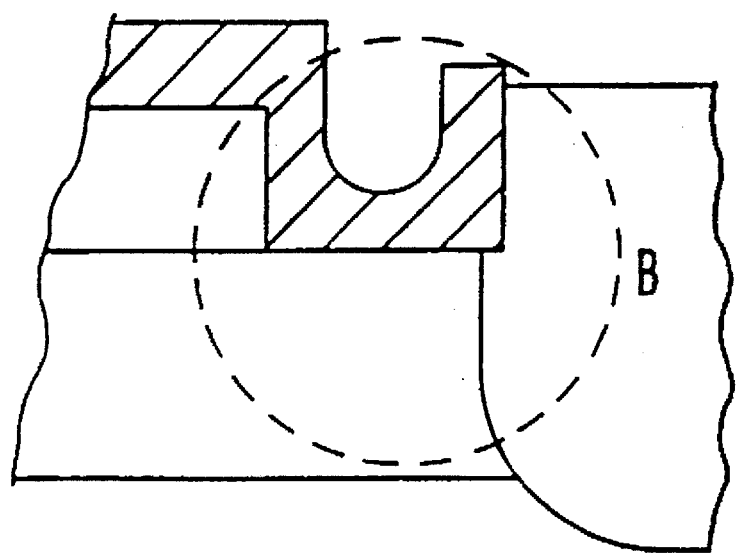

In the MOS device of FIG. 3, a region indicated by a dotted line "A" is a channel region and a region indicated by a dot line "B" is an impurity region having a relatively high concentration in comparison with the region "A". The groove structure identified by reference numeral 1a in FIG. 2C may be a rectangular or polygon shape as illustrated in FIG. 3 or have a rounded shape as illustrated in FIG. 6 formed thus prevents an electric field produced in the vicinity of a drain from penetrating into the channel region "A" which restrain s a short channel effect.

In addition, a length of an effective channel is increased by the groove structure, and also a junction depth of source/drain regions can be further increased by a depth of the groove in comparison with the conventional MOS device.

Accordingly, in the MOS device fabricated by the present invention, source/drain resistance can be lowered, and lessening of reliability from degrading due to a junction spike of a metal interconnection and/or an electro-migration is prevented.

In the case of an MOS device having an N-type-surface channel according to the present invention, P⁻ type-impurity concentration of the channel region "A" is the same as that of a well, and the channel region "B" in the groove is doped with a relatively high impurity concentration of P⁰ type in comparison with the channel region "A". The channel region "B" is formed during ion-injection for controlling a threshold voltage of the MOS device. Also, the source/drain region is doped with a P⁺ type impurity concentration.

Figure 4:
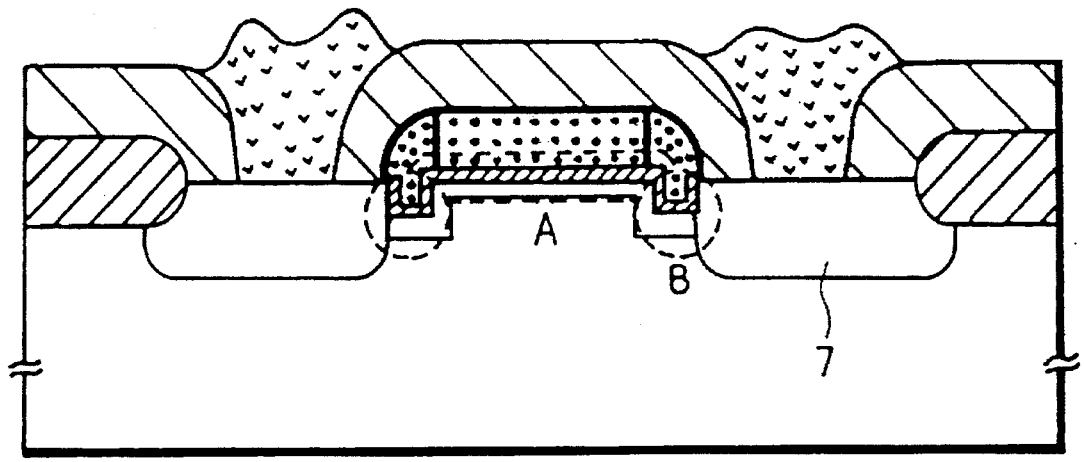
FIG. 4 is a cross-sectional view showing the construction of a further MOS device which is manufactured in accordance with the method of the present invention.

FIG. 4 shows the structure of the MOS device which is manufactured in accordance with a further embodiment of the present invention.

In the MOS device of FIG. 4, the channel regions "A" and "B" also are doped with a relatively high impurity concentration of P⁰ type in comparison with a well region.

Figure 5:
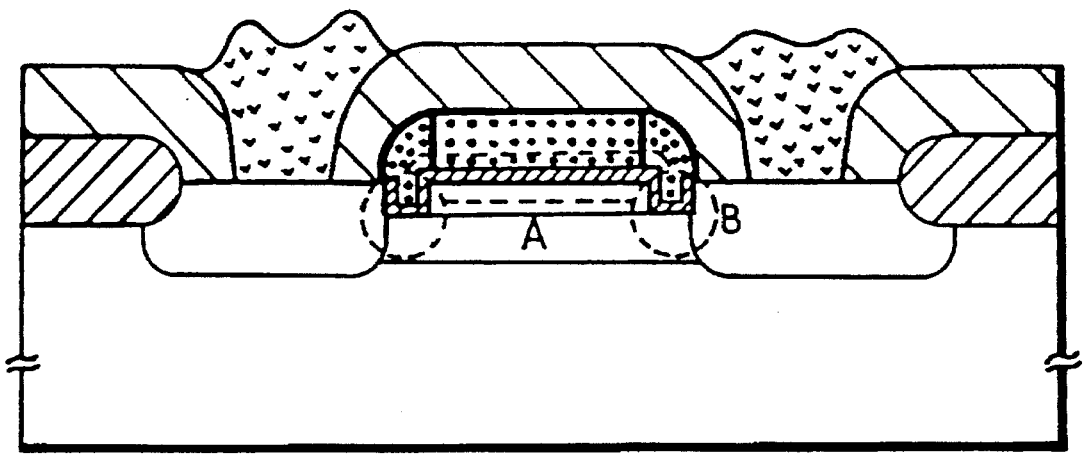
FIG. 5 is a cross-sectional view showing the construction of another MOS device which is manufactured in accordance with the FIG. 6 is an enlarged view illustrating a recess portion having a rounded shape. method of the present invention.

FIG. 5 shows the structure of the MOS device which is manufactured in accordance with another embodiment of the present invention.

As shown in FIG. 5, the channel region "A" has the same P⁻ type impurity as that of a well region, the channel region "B" in the groove has a relatively high impurity concentration of P⁰ type in comparison with the well region, and a P⁰ type impurity region is formed in the substrate.

As described above, the MOS device having the groove structure which is formed at both sides of a gate (i.e. at edge of one side of a source/drain region) in accordance with the method of the present invention, can prevent a diffusing layer from penetrating into the channel, and thereby enabling a length of an effective channel to be further lengthened in comparison with that of the conventional MOS device. Therefore, in the MOS device of the present invention, an electric field produced in the vicinity of a drain can be prevented from penetrating into the channel region just under the gate, and as a result a short channel effect can be restrained. Also, in the MOS device of the present invention, leakage current caused by a punch-through or a drain induced barrier lowering can be restrained.

In addition, a junction depth of source/drain regions can be further increased by a depth of the groove of the MOS device in comparison with the conventional MOS device, and thereby a source/drain resistance can be further lowered, and it is possible to prevent degrading of reliability due to a junction spike of a metal interconnection and/or an electromigration.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A metal oxide semiconductor device with a self-aligned groove channel structure comprising:

a substrate in which a first channel region of a first conductivity type and source and drain regions of a second conductivity type are formed, a first gate insulating layer formed on the first channel region, and a first gate electrode formed in contact with the gate insulating layer;

a second gate electrode having a self-aligned groove structure formed in the substrate at first and second sides of the first gate electrode and the first channel region;

a second gate insulating layer formed between the substrate and the second gate electrode;

a non-planar second channel region of the first conductivity type formed under the second gate insulating layer and doped with a different concentration of an impurity from the first channel region and wherein the self-aligned groove structure comprises first and second grooves respectively disposed at the first and second sides of the first gate electrode and the first channel region, each groove having first and second sidewalls extending vertically in the substrate, the first sidewall of the first groove extending from a top surface of the first channel region downward to a bottom of the first groove in the substrate and the second sidewall of the first groove extending upward from the bottom of the first groove to a top surface of one of the source and drain regions and the first sidewall of the second groove extending from the top surface of the first channel region downward to a bottom of the second groove and the second sidewall of the second groove extending upward from the bottom of the second groove to a top surface of another of the source and drain regions.

2. The metal oxide semiconductor device as defined in claim 1, wherein:

an impurity concentration of the first channel region is lower than an impurity concentration of the second channel region, and the first conductivity type is N type.

3. The metal oxide semiconductor device as defined in claim 1, wherein:

an impurity concentration of each of the first and second channel regions is higher than an impurity concentration of the substrate, and the first conductivity type is N type.

4. The metal oxide semiconductor device as defined in claim 1, wherein:

an impurity concentration of the first channel region is lower than an impurity concentration of the second channel region, and the first conductivity type is P type.

5. The metal oxide semiconductor device as defined in claim 1, wherein:

an impurity concentration of each of the first and second channel regions is higher than an impurity concentration of the substrate, and the first conductivity type is P type.

6. A metal oxide semiconductor device with a self-aligned groove channel structure comprising:

a substrate in which a first channel region of a first conductivity type and source and drain regions of a second conductivity type are formed, a first gate insulating layer formed on the first channel region, and a first gate electrode formed in contact with the gate insulating layer;

a second gate electrode having a self-aligned groove structure formed in the substrate at first and second sides of the first gate electrode and the first channel region;

a second gate insulating layer formed in surface contact with the groove structure and between the substrate and the second gate electrode;

a non-planar second channel region of the first conductivity type formed under the second gate insulating layer and doped with a different concentration of an impurity from the first channel region and wherein the self-aligned groove structure comprises first and second grooves respectively disposed at the first and second sides of the first gate electrode and the first channel region, each groove having first and second sidewalls extending vertically in the substrate, the first sidewall of the first groove extending from a top surface of the first channel region downward to a bottom of the first groove in the substrate and the second sidewall of the first groove extending upward from the bottom of the first groove to a top surface of one of the source and drain regions and the first sidewall of the second groove extending from the top surface of the first channel region downward to a bottom of the second groove and the second sidewall of the second groove extending upward from the bottom of the second groove to a top surface of another of the source and drain regions.

7. The metal oxide semiconductor device as defined in claims 6, wherein:

an impurity concentration of the first channel region is lower than an impurity concentration of the second channel region, and the first conductivity type is N type.

8. The metal oxide semiconductor device as defined in claim 6, wherein:

an impurity concentration of each of the first and second channel regions is higher than an impurity concentration of the substrate, and the first conductivity type is N type.

9. The metal oxide semiconductor device as defined in claim 6, wherein:

an impurity concentration of the first channel region is lower than an impurity concentration of the second channel region, and the first conductivity type is P type.

10. The metal oxide semiconductor device as defined in claim 6, wherein:

an impurity concentration of each of the first and second channel regions is higher than an impurity concentration of the substrate, and the first conductivity type is P type.

* * * * *